(12) United States Patent
Scott et al.

(10) Patent No.: US 7,466,578 B2
(45) Date of Patent: Dec. 16, 2008

(54) METHODS AND SYSTEMS FOR READ-ONLY MEMORY

(75) Inventors: David B. Scott, Plano, TX (US); Radu Avramescu, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 11/604,960

(22) Filed: Nov. 28, 2006

(65) Prior Publication Data

US 2008/0123388 A1 May 29, 2008

(51) Int. Cl.
*G11C 17/00* (2006.01)
(52) U.S. Cl. .............................. 365/94; 365/63; 365/51
(58) Field of Classification Search ................ 365/104, 365/94, 63, 51, 185.17, 185.18, 185.05; 257/390–391, 257/E27.103, E27.102
See application file for complete search history.

(56) References Cited

U.S. PATENT DOCUMENTS 5,351,255 A * 9/1994 Schetzina .................... 257/12
5,742,540 A * 4/1998 Wakasugi et al. ........... 365/104
6,879,509 B2 * 4/2005 Evans et al. ................. 365/104
2002/0039305 A1 4/2002 Becker

OTHER PUBLICATIONS

"Numerical Analysis of the Effect of Coating Microstructure on Three-Dimensional Crack Propagation in the Coating Under Rolling Contact Fatigue Conditions", I. A. Polonsky and L. M. Keer, Transactions of the ASME, Journal of Tribology, vol. 124, Jan. 2002, 6 pgs.
"Tribological properties and folling-contct-fatigue lives of TiN/SiN$_x$ multilayer coatings", Yu-Hsia Chen, Igor A. Polonsky, Yip-Wah Chung and Leon M. Keer, Elsevier Science, Sruface and Coatings Technology 154 (2002) pp. 152-161.

* cited by examiner

*Primary Examiner*—David Lam
(74) *Attorney, Agent, or Firm*—Wade J. Brady, III; Frederick J. Telecky, Jr.

(57) ABSTRACT

One embodiment of the present invention relates to a read only memory (ROM) that includes a memory cell pair. The memory cell pair includes a first memory cell and a second memory cell that share a common drain that is associated with the memory cell pair. The memory cell also includes a bitline configured to provide data from the first and second memory cells, wherein the bitline is electrically isolated from the common drain. Other methods and systems are also disclosed.

17 Claims, 16 Drawing Sheets

METHODS AND SYSTEMS FOR READ-ONLY MEMORY

FIELD OF INVENTION

The present invention relates generally to semiconductor devices and more particularly to improved methods and systems for read only memory devices.

BACKGROUND OF THE INVENTION

Semiconductor memory devices store data and/or program code in personal computer systems, embedded processor-based systems, video image processing circuits, communications devices, and the like. A read-only memory (ROM) is one type of semiconductor memory device that is used to store fixed data, such as instructions needed to boot-up an electronic device.

FIG. 1A illustrates a prior art ROM memory device 100 comprising eight memory cells, arranged in four memory cells pairs (e.g., 102) wherein each memory cell pair comprises two of the memory cells (e.g., 104, 106) that share a common drain. Each of the memory cells includes a word line positioned over an active region, a shared bit line contact that couples the bit line the common drain of the memory cell pair, and an optional ground contact that couples an optional source of the cell to ground. More specifically, four of the cells are arranged in a first row and are associated with the first word line (WL0), and the other four cells are arranged in a second row and are associated with the second word line (WL1).

The first memory cell 104 includes the first word line (WL0) that runs over the active region; a shared bit line contact 108 coupling the bit line (BL0) to the common drain 110; and a first ground contact 112 coupling the source 114 to ground (VSS0). As shown, the first memory cell so configured stores a "0" data value. Similarly, the second memory cell 106 includes a second word line (WL1) that runs over the active region, the shared bit line contact 108 coupling the bit line (BL0) to the common drain 110, and a second ground contact 116 coupling the source 118 to ground (VSS1). This second memory cell is configured to store a "0" data value. Thus, the first and second memory cells 104, 106 form a memory cell pair 102, wherein the shared bit line contact 108 is common to both the first memory cell and the second memory cell.

In operation, the first word line (WL0) is utilized to address the first memory cell 104 and the second word line (WL1) is utilized to address the second memory cell 106, both of which can affect the data provided on the bit line (BL0).

For the first memory cell 104 the bit line (BL0) is initially pre-charged to a high voltage (i.e., to a logical "1"). While the first word line (WL0) is low, the bit line maintains its state, usually high, because the active region under the word line isolates the common drain 110 from the first source 114. However, when the first word line (WL0) is asserted high, the active region becomes conductive and couples the common drain and bit line (BL0) to the first source and ground wire (VSS0), thereby causing the bit line (BL0) to be pulled low.

The second memory cell 106 operates in a similar manner. Specifically, asserting the second word line (WL1) high causes the active region underneath it to conduct, thus creating a connection between the bitline (BL0) and ground (VSS1) via the common drain and the second source. Therefore, the bit line (BL0) is again pulled low.

In typical existing methods of programming such a ROM, the shared bit line contacts (e.g., 108) are added to each and every column of the memory array. Based on whether a memory cell stores a "1" or "0" data value, the ROM is programmed by selectively removing portions of the active region. For example, in cells where a "1" value is stored, the active region can be removed in areas surrounding the word line and in the source region, as shown in FIG. 1B. When the word line of such cells is asserted, the bit line is not coupled to ground because there is no active region through which carriers can flow. Therefore, the bit line will retain the pre-charged voltage and the device will provide a "1" data value from the cell.

While such prior art methods and devices are sufficient for their stated purpose, such methods and devices have shortcomings. For example, as shown in FIG. 1C, when both memory cells in a memory cell pair are programmed to store a "1" value, the active region and source in both memory cells are removed. While this does achieve the necessary data programming, this can violate a well-known design rule that requires a minimum density of active region. The active region can include sources and drains. For example, in one embodiment, the minimum density of active region needs to be 30%. If a substantial number of memory cells store a "1" value, the active region of any given die will be less than 30%.

Another shortcoming of such prior art methods and devices is that such methods do not optimize the density of a ROM device. As shown in FIG. 1C, one limiting factor in determining the height of a row of ROM memory cells is the dimensions associated with a memory cell pair in which both memory cells store a "1" value. As shown in FIG. 1C, the height 150 of the portion of the prior art memory cell between the word lines (WL0, WL1) is the sum of five components, namely: wordline to active 152, active to contact 154, contact height 156, contact to active 158, and active to wordline 160. In one embodiment, for example, the total height of the portion of the memory cell between the word lines is 260 nm; wherein the five components have values of 55 nm, 30 nm, 90 nm, 30 nm, and 55 nm, respectively. In addition, a repeatable distance 162 may be defined by including the width 164 of one wordline. This repeatable distance 162 could be 335 nm in one embodiment.

Therefore, a need has arisen to provide a ROM memory cell that cures the deficiencies of the prior art.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the present invention relates to a read only memory (ROM) that includes a memory cell pair. The memory cell pair includes a first memory cell and a second memory cell that share a common drain that is associated with the memory cell pair. The memory cell also includes a bitline configured to provide data from the first and second memory cells, wherein the bitline is electrically isolated from the common drain.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1A:
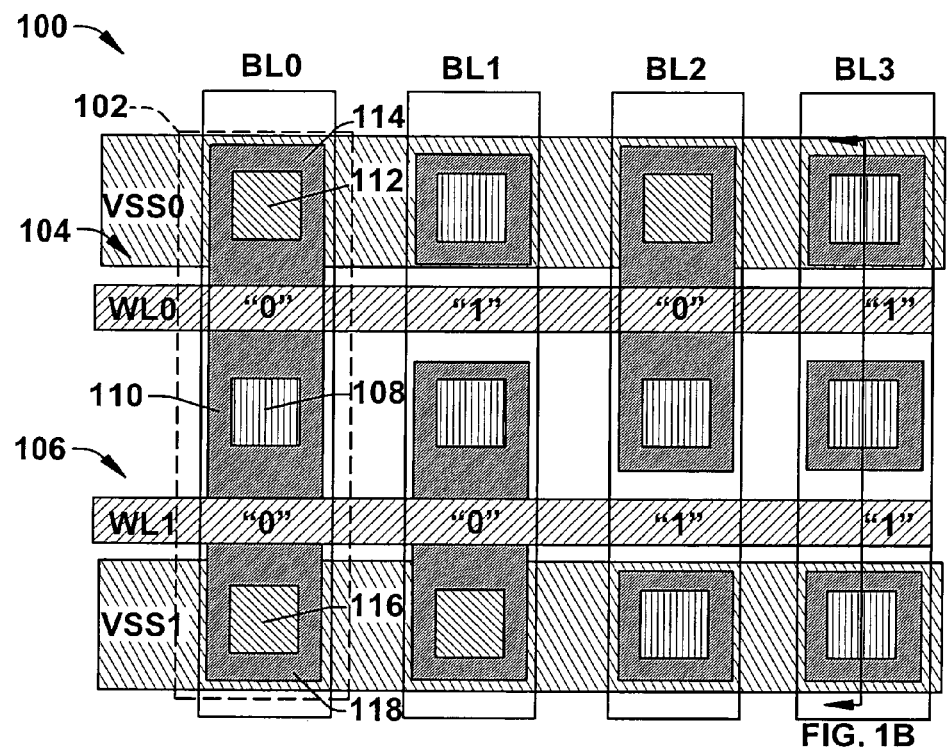
FIGS. 1A-1C are schematics of a ROM of the prior art.
Figure 1B:
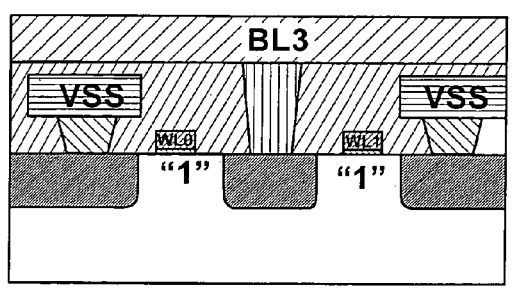

One or more implementations of the present invention will now be described with reference to the attached drawings, wherein like reference numerals are used to refer to like elements throughout.

In order to read from a ROM memory device, a user typically presents an address and a various control signals to the ROM. The ROM typically takes the address and uses it to determine which individual memory cell within the memory array the user wishes to access. In order to achieve this one-to-one mapping the ROM will generally include an address decoder that generates signals on the word lines so as to access the desired cell. When the word lines are so asserted, the ROM provides the stored data value to the user. The ROM may include various I/O circuitry to sense the data in the cells and suitably present it to the user. For example, one ROM could include sense amps or other similar voltage level detection circuitry. As described in greater detail herein, the memory cells of the ROM are programmed to either a "1" or "0", depending on the desired data to be stored in the ROM.

Figure 2A:
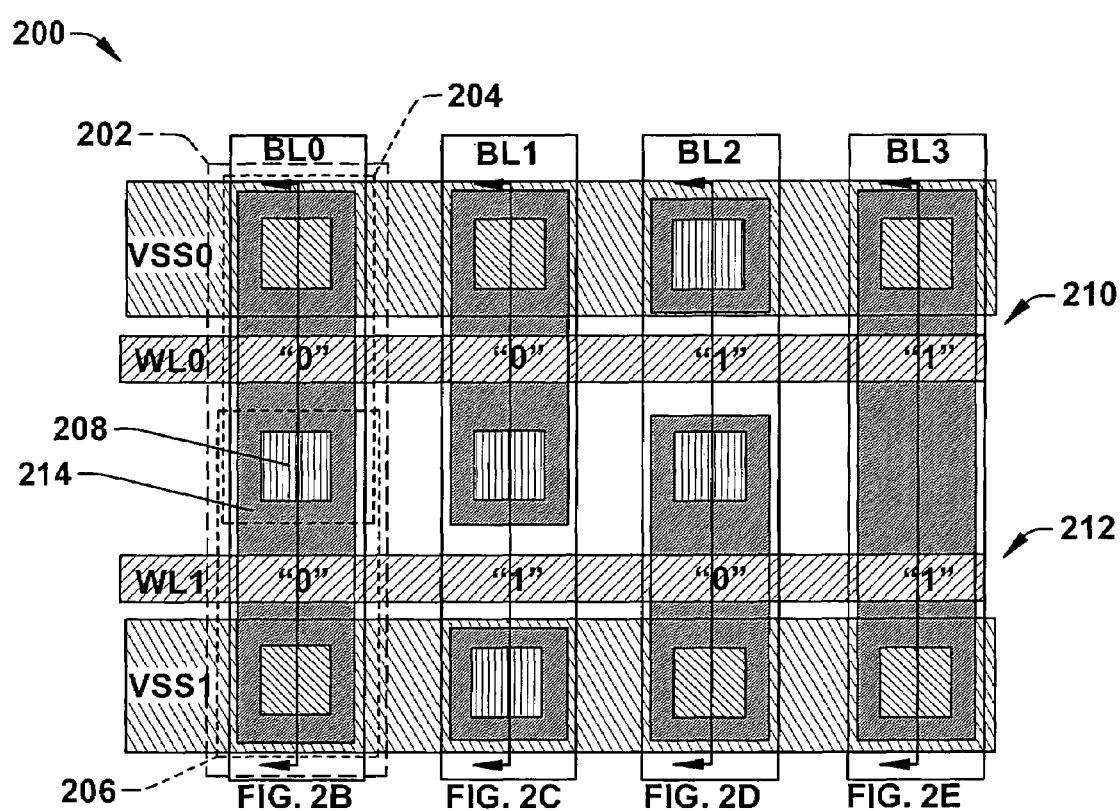
FIGS. 2A-2E are schematics of one embodiment of a ROM in accordance with aspects of the present invention.

FIG. 2A shows one embodiment of a read-only memory (ROM) in accordance with aspects of the present invention. As shown, aspects of the present invention relate to a ROM memory device 200 comprising a number of memory cells that are arranged in memory cell pairs wherein each memory cell pair (e.g., 202) comprises two memory cells (e.g., 204, 206) that may share an optional shared bit line contact 208. Further, the individual memory cells of the memory cell pairs are arranged in rows 210, 212 associated with individual word lines WL0, WL1, respectively, where the individual word lines are positioned over an active region of the substrate. It will be appreciated that the memory cells shown in FIG. 2A can be "tiled" in a repetitive pattern and thus can be extended to any size memory array. FIG. 2A also shows four center lines taken along the four memory cell pairs, which center lines relate to the cross-sections shown in FIG. 2B-2E as indicated. Each of these cross-sectional views is discussed in more detail further herein.

Referring still to FIG. 2A, one can see that the "1"s and "0"s can be programmed in the ROM by a combination of processes. For example, contacts can be selectively placed in various positions in the memory array in order to facilitate the desired data storage. In addition, active regions can be selectively placed or removed at various positions to facilitate desired data storage. As shown, when either of the memory cells in the row of memory cell pairs store a "0" data value, a shared bit line contact (e.g. 208) couples the bit line (e.g., BL0) to the common drain (e.g., 214) of a memory cell pair. However, if both memory cells of the memory cell pair store a "1" data value, there is no shared bit line contact for that pair, while the active regions are still in place. In the prior art, by contrast the active regions were removed in cases where a memory cell pair stored two "1" values. As will be appreciated, the features of this configuration can be used to remedy the deficiencies of the prior art.

Figure 2B:
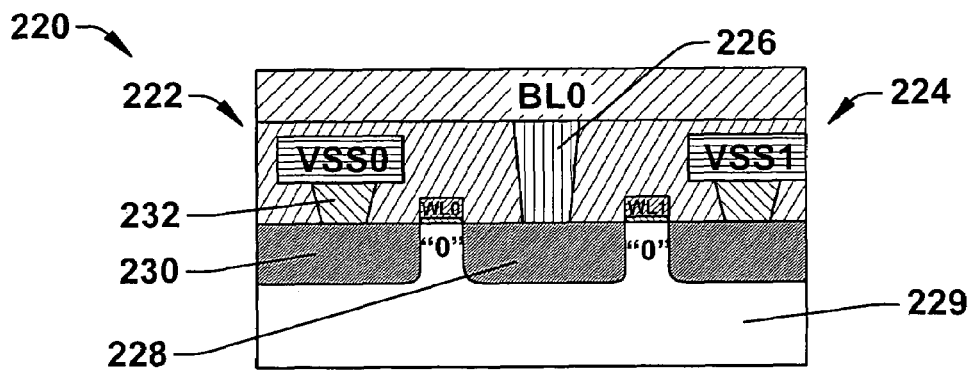

In the first column of memory array 200, which is associated with BL0, the memory cells of the memory cell pair are both configured to store data values of "0." Referring now to FIG. 2B, one can see the first memory pair 220 comprises two memory cells 222, 224, each of which can provide read data over the bit line (BL0). More particularly, the first cell 222 comprises: a shared bit line contact 226 that couples the bit line (BL0) to a common drain 228, where the common drain 228 is buried in the substrate 229; a word line WL0 positioned over an active region of the substrate and separated there from by a gate oxide; and a source 230 that is buried in the substrate, wherein the source can be coupled to a ground wire VSS0 via a ground contact 232. The second cell 224 is similarly configured.

When the word line (WL0) of the first memory cell 222 is asserted, a depletion region is created in the active region, causing electrical carriers (i.e., holes and electrons) to be free to move about. Because there is a voltage difference between the source 230 (which is coupled to VSS0 or ground) and the common drain (which is coupled to BL0 that is pre-charged to a relatively high voltage), the charged carriers are accelerated through the active region, thereby causing charge to flow and ultimately pulling the bit line low. Similar functionality also occurs with respect to the second memory cell 224.

Figure 2C:
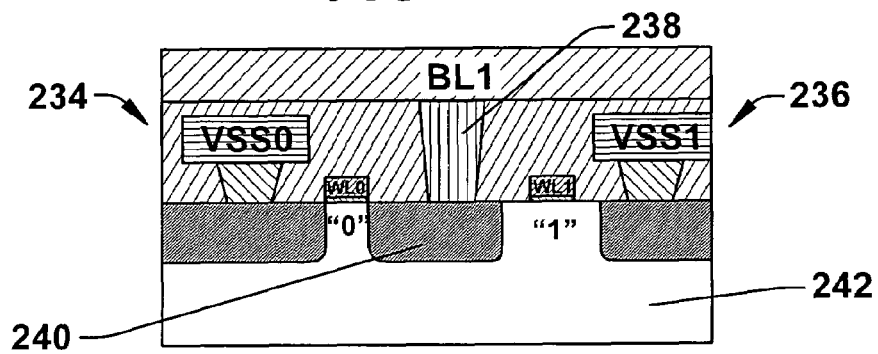

In the second column of memory array 200, which is associated with BL1, the third and fourth memory cells are configured to store a "1" and "0", respectively. Referring now to FIG. 2C, one can see that the second memory pair 232 comprises two memory cells 234, 236 each of which can provide read data over BL1. The third memory cell 234 is similarly configured to the first and second memory cells so as to store a "0" value. The fourth memory cell 236, however, is configured to store a "1" value. Thus, the fourth memory cell 236 comprises: a shared bit line contact 238 that couples the bit line (BL1) to a common drain 240. The word line (WL1) is still positioned over the substrate 242, however, active regions are no longer adjacent to the word line (i.e., they have been removed). In addition, the source and ground contact of the fourth memory cell have also been removed. When the word line (WL1) is asserted with respect to the fourth cell 236, no depletion region will be created, and thus carriers will not flow from the bit line to VSS2 or ground. Therefore, the fourth cell 236 will return a value of "1" (e.g., the pre-charged voltage) when accessed by a user.

Figure 2D:
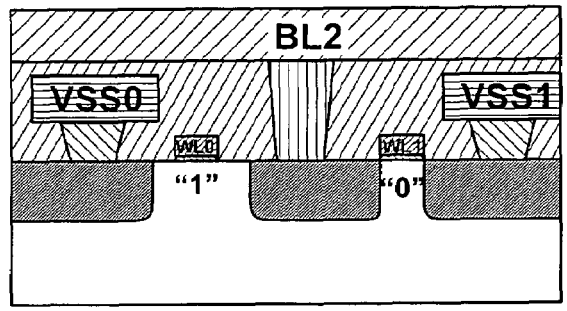

The third column of memory array 200, which is associated with BL2, is substantially the same as the second column of memory array 200, except that the stored values and their associated structures are reversed. This is shown in FIG. 2D.

The fourth column of memory array 200, which is associated with BL3, is now described with reference to FIG. 2E. The fourth memory cell pair 250 includes a first memory cell 252 having a first source 254 and a common drain 256, wherein the first source and the drain are separated by a distance related to a first wordline WL0 of the ROM. The fourth memory cell pair 250 further includes a second memory cell 258 that shares the common drain 256 with the first memory cell 252, wherein the second memory cell 258 has a second wordline WL1 associated therewith. The bitline BL3 of the fourth memory cell pair provides data from the first and second memory cells 252, 254 as a function of the first and second wordlines WL0, WL1, respectively, wherein the bitline BL3 is electrically isolated from the common drain 256. In one embodiment, the fourth memory cell pair has a continuous active region between the wordlines WL0 and WL1 that extends entirely between the first and second wordlines.

When either word line (WL0, WL1) is asserted in conjunction with an access to the fourth memory cell pair 250, the bitline BL3 is electrically isolated from the common drain 256. More specifically, one or more dielectric layers 260 separate the bit line BL3 from the common drain. As shown in FIG. 2E, the sources 254, 262 of the memory cells in the fourth column are still found in the substrate. In various embodiments, ground contacts 264, 266 still couple the sources to ground, although in other embodiments ground contacts 264, 266 may be absent. In various embodiments, other features, such as the word lines, gate oxides, ground lines, and the like, are optional.

Figure 2E:
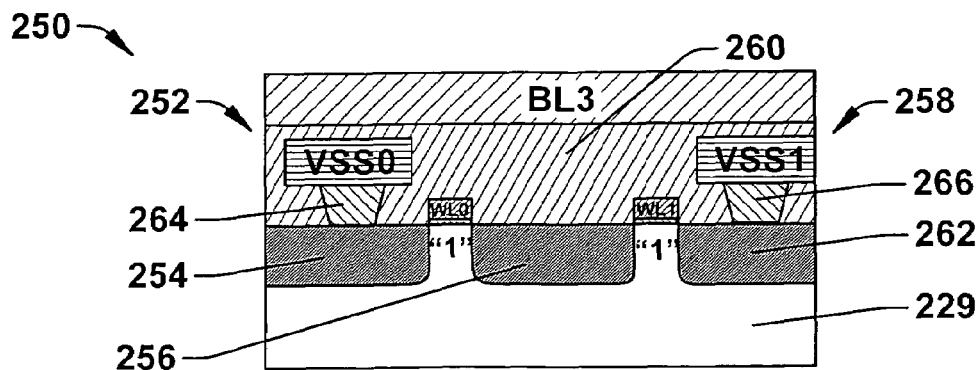

By employing such a configuration as shown in FIG. 2E, one can alleviate the inability of the prior art to meet the requirement of a given minimum active area density, regardless of the precise data in the array. Whereas the prior art removed the sources of memory cell pairs that stored two "1" values, the ROM in FIG. 2E can leaves one or more of the sources in the substrate. As previously mentioned, when a substantial number of memory cells in the array store a "1" value, the memory array would be unable to meet the minimum active region density requirements. However, the memory cell pair of FIG. 2E allows these requirements to be met. In one embodiment, even if a substantial number of memory cells store a "1" value, the minimum active area is at least approximately 30%.

Figure 1C:
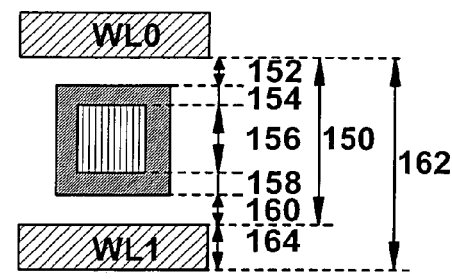
Figure 3:
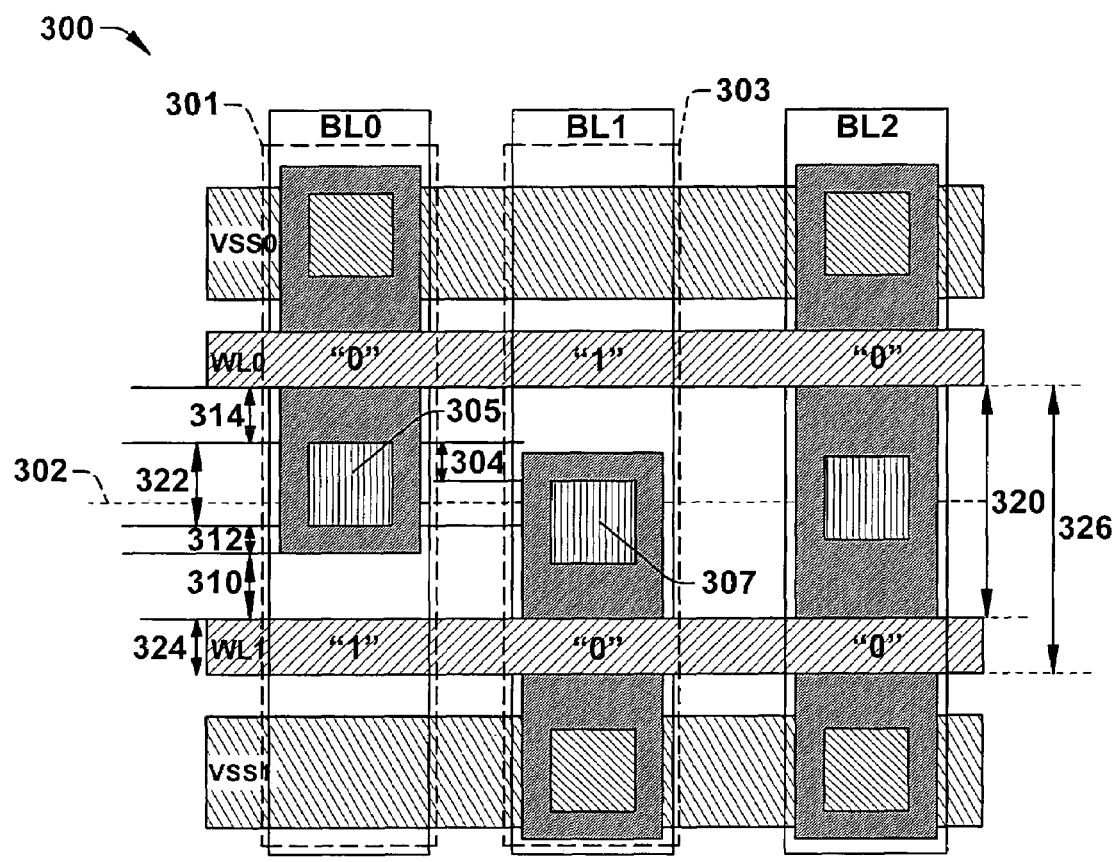
FIG. 3 is another schematic of one embodiment of a ROM in accordance with aspects of the present invention.

FIG. 3 shows another embodiment of the present invention that achieves a more densely packed memory array than was achievable in the prior art. As shown, the figure illustrates a number of memory cell pairs (e.g., 301, 303) that are associated with wordlines WL0, WL1 that can select a row of memory cells and thereby provide read data over bitlines BL0, BL1, and BL2. Contacts 305, 307 couple bitlines BL0 and BL1 to two of the memory cell pairs 301, 303, respectively. The two contacts 305, 307 are staggered with respect to one another as measured between the wordlines WL0, WL1 associated with the two memory cell pairs. Thus, this ROM 300 employs staggered contacts to achieve a greater packing density, wherein staggering can be evidenced by an offset as measured between two word lines WL0, WL1 associated with two memory cell pairs. This embodiment may be useful because the shared bit line contact associated with memory pair cells storing two "1" values (e.g., as shown in FIG. 1C) is no longer necessary.

More specifically, in the illustrative embodiment the shared bit line contacts are staggered relative to a central plane 302. As shown, for a memory cell pair that stores two "0" values (e.g., memory cell pair associated with BL2), the shared bit line contact 304 may be positioned at an approximately central position on the central plane 302. By contrast, however, for a memory cell pair that stores one "0" value and one "1" value (e.g., memory cell pair associated with BL0 or BL1), the shared bit line contacts 306, 308 may be staggered relative to the central plane 302. By staggering these shared bit line contacts 306, 308, the present invention allows the packing density of the memory cells to be increased beyond what was known in the prior art.

In the illustrated embodiment, the offset 304 between two shared bit line contacts 306, 308 can be characterized by the following expression:

Offset=(WL1-to-active)+(active-to-contact)−(contact-to-WL0)

wherein (WL1-to-active) is reference numeral 310, (active-to-contact) is reference numeral 312, and (contact-to-WL0) is reference numeral 314 in FIG. 3. Thus, one can see that the distance between word lines is no longer limited to the dimensions associated with a memory cell pair that stores two "1" values (e.g., as in the prior art ROM shown in FIG. 1C), and that a more compact cell is achieved by "squeezing" the word lines together.

In one embodiment, for example, the distance 320 between two word lines could be approximately 225 nm, although it will be appreciated that such distance could be any value and could be scaled depending on the specific fabrication technology used to manufacture the ROM and other implementation details. More specifically, in one embodiment this distance 320 could be broken down into four components: 310, 312, 322, and 314. A distance 314 from the first word line (WL0) to the edge of a shared bit line contact 306 could be approximately 50 nm. A width 322 of the shared bit line contact 306 could be approximately 90 nm. A distance 312 from the other edge of the contact to an active edge could be approximately 30 nm. Lastly, the distance 310 from the edge of active to the other word line (WL1) could be approximately 55 nm. In addition, a memory cell pair could include word lines that have a width 324 of approximately 75 nm in one embodiment, which could result in an effective cell height 326 of approximately 300 nm. Again, it will be appreciated that these are merely illustrative numerical values, and that the present invention extends to other values and other ratios of values. Therefore, the present invention is only limited by the breadth of the claims and not any specific details recited in this detailed description.

Figure 4:
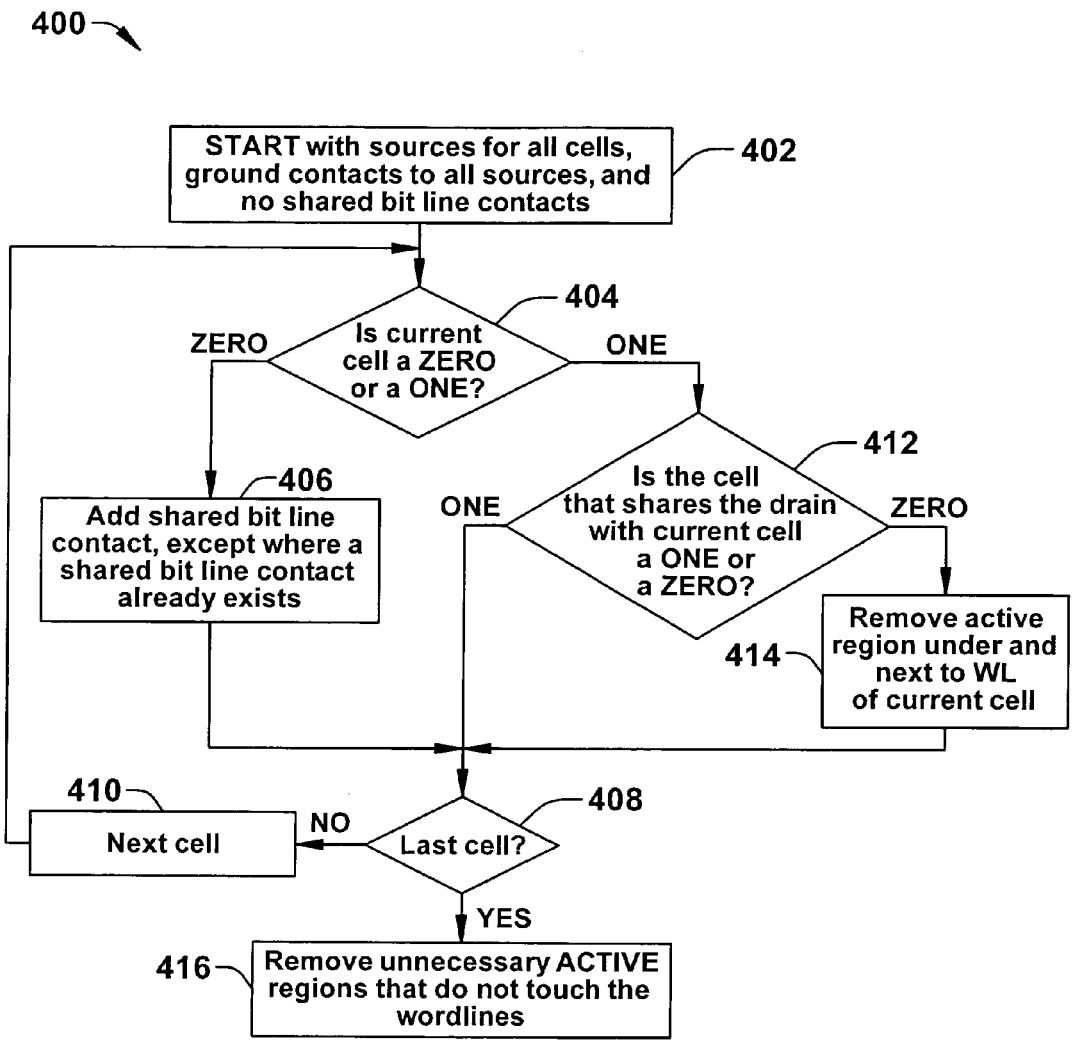
FIGS. 4 and 4A-4J is one embodiment of a method in accordance with aspects of the present invention.
Figure 5:
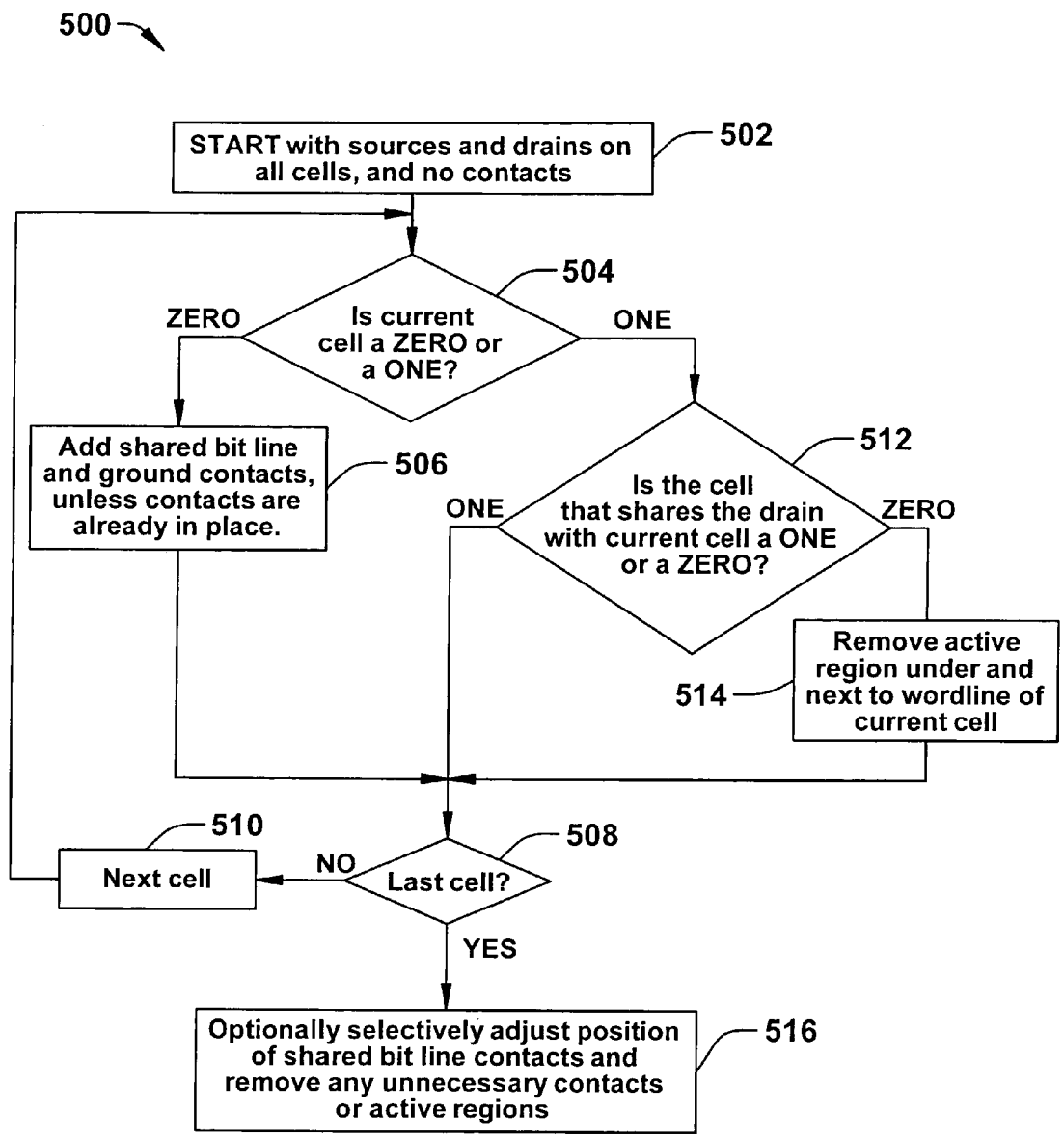
FIGS. 5 and 5A-5J is another embodiment of a method in accordance with aspects of the present invention.

Exemplary methods and for programming a ROM in accordance with the present invention are illustrated in FIGS. 4-5. More particularly, FIG. 4 relates to a somewhat general method 400 of programming a ROM, while FIG. 5 relates to another method 500 directed towards limiting the height of a ROM memory cell. While the methods 400, 500 are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Both methods 400 and 500 are now described with reference to flow diagrams (FIG. 4 and FIG. 5, respectively) and schematic representations (FIGS. 4A-4J and FIG. 5A-5J, respectively). The illustrated flow diagrams show general functional steps, while the schematic representations show what the ROM mask set looks like during the various programming steps of eight memory cells. In particular, the dashed regions in the schematic representations refer to the memory cell of the ROM that is currently being programmed. After the ROM mask set has been "programmed", the finalized design can be submitted to a fabrication facility to manufacture the actual ROM device.

Referring now to FIG. 4 and FIGS. 4A-4J, a somewhat general method 400 for programming a ROM is described. At 402 an initial mask set is provided in which all memory cells have sources, a ground contact to each of the sources, and no shared bit line contacts. Other initial mask sets could have various configurations, depending on the implementation.

At 404, method 400 determines whether the current memory cell is to store a "0" or a "1". If the cell is to store a "0" ("ZERO" at 404), then the method proceeds to step 406, where a shared bit line contact is added to the memory cell pair, except where a shared bit line contact already exists.

The method 400 then proceeds to step 408 and determines if the previously processed memory cell was the last cell to be programmed. If not (NO at 408), then the method progresses to the next memory cell in 410 before returning to 404. The next cell is then programmed.

If the current memory cell is to store a "1" value ("ONE" at 404), a determination is made at 412 as to whether the memory cell that shares the drain with the current memory cell is a one or a zero. If the cell that shares the drain with the current cell stores a one value (ONE at 412), no shared bit line contact is placed, but rather the method proceeds to 410 and the next cell is considered. However, if the cell that shares the drain with the current cell stores a zero value (ZERO at 412), the method proceeds to 414 and the active area under and next to the word line of the current cell is removed, thereby programming the current cell to a one value. In one embodiment, the ground contact and source remain in place at this point because they might be needed by the cells that share the source or the ground contact of the current cell.

After all the cells are programmed, the method 400 proceeds to step 416 and removes the unnecessary active regions that do not touch the word lines. For example, these unnecessary active regions can be sources shared by two adjacent cells which were both programmed to one.

Figure 4A:
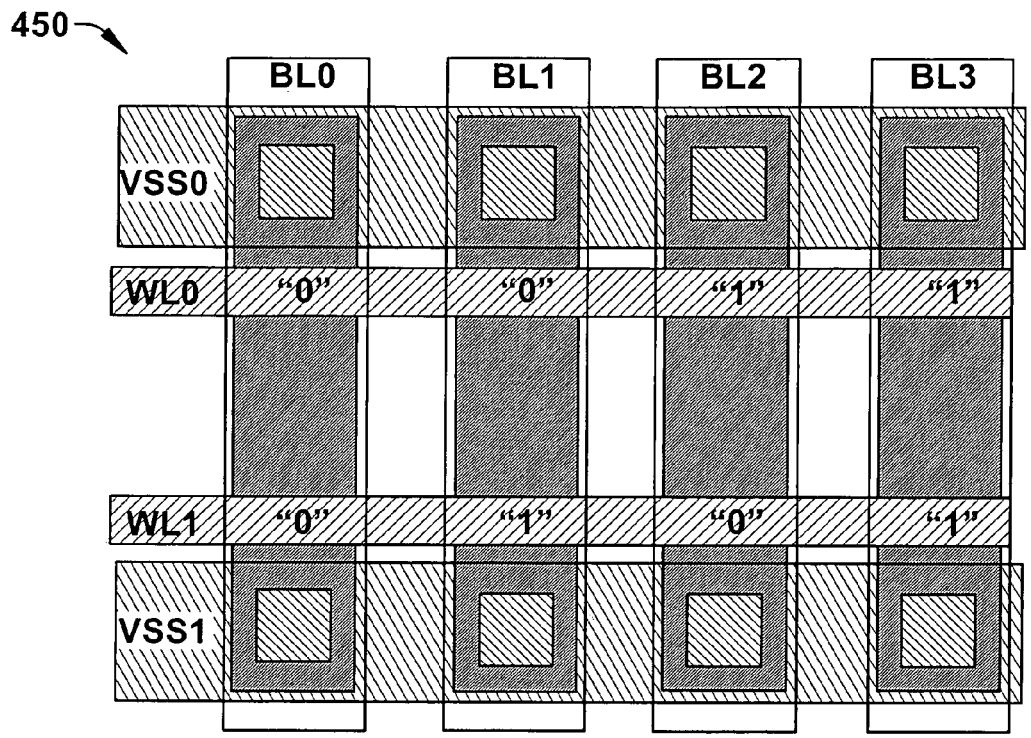

FIGS. 4A-4J now discuss one embodiment in accordance with method 400 for programming a ROM array that consists of eight memory cells. FIG. 4A shows an initial mask set 450 and logical values (i.e., "1"s and "0"s) that are to be programmed thereon. As previously mentioned, all of the memory cells have a source, a ground contact to the source, and no shared bit line contacts.

Figure 4B:
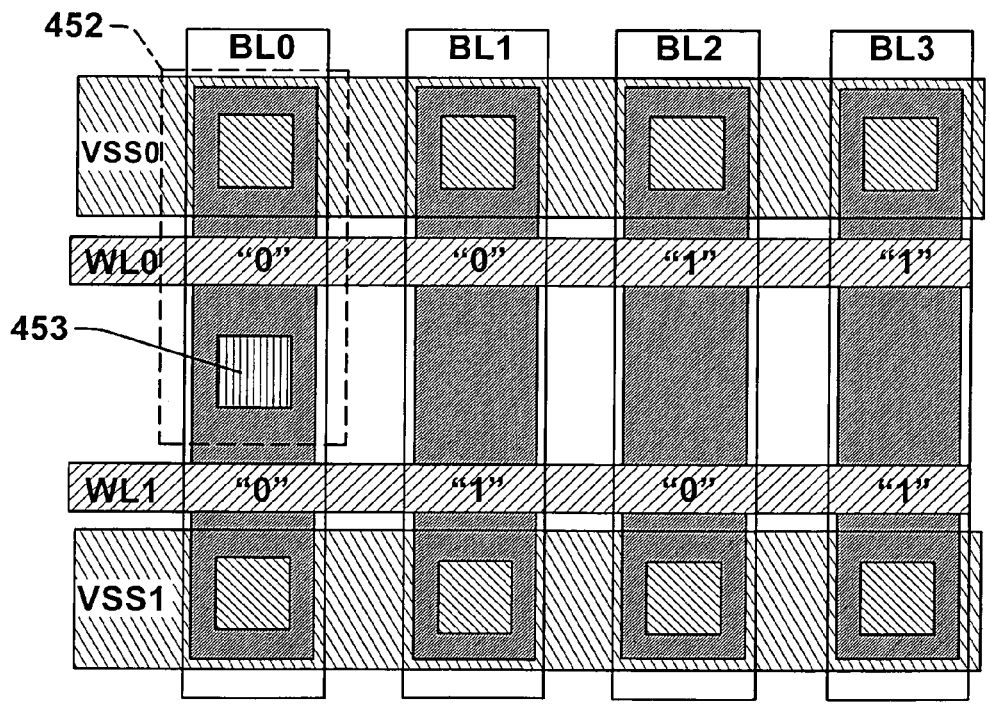

FIG. 4B shows the programming of first memory cell 452, which can be programmed in accordance with 406 of FIG. 4. Because the first memory cell 452 is to store a "0", a shared bit line contact 453 has been added to the memory cell pair to couple BL0 to the common drain. Thus, when WL0 is enabled, BL0 will be comparably coupled to VSS0 and will pull BL0 low, providing the desired "0" data.

Figure 4C:
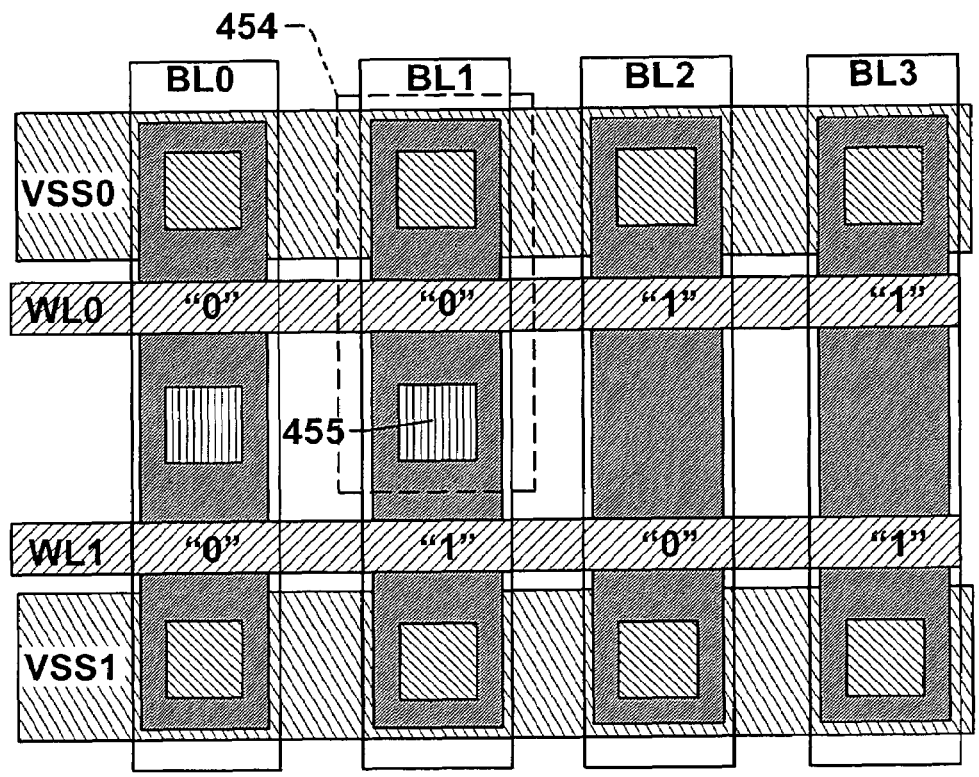

FIG. 4C shows the programming of second memory cell 454, which can again be programmed in accordance 406 in FIG. 4, albeit after the current cell has been incremented to the next cell. Again, a shared bit line contact 455 has been added to the memory cell pair, in this case to couple BL1 to VSS0.

Figure 4D:
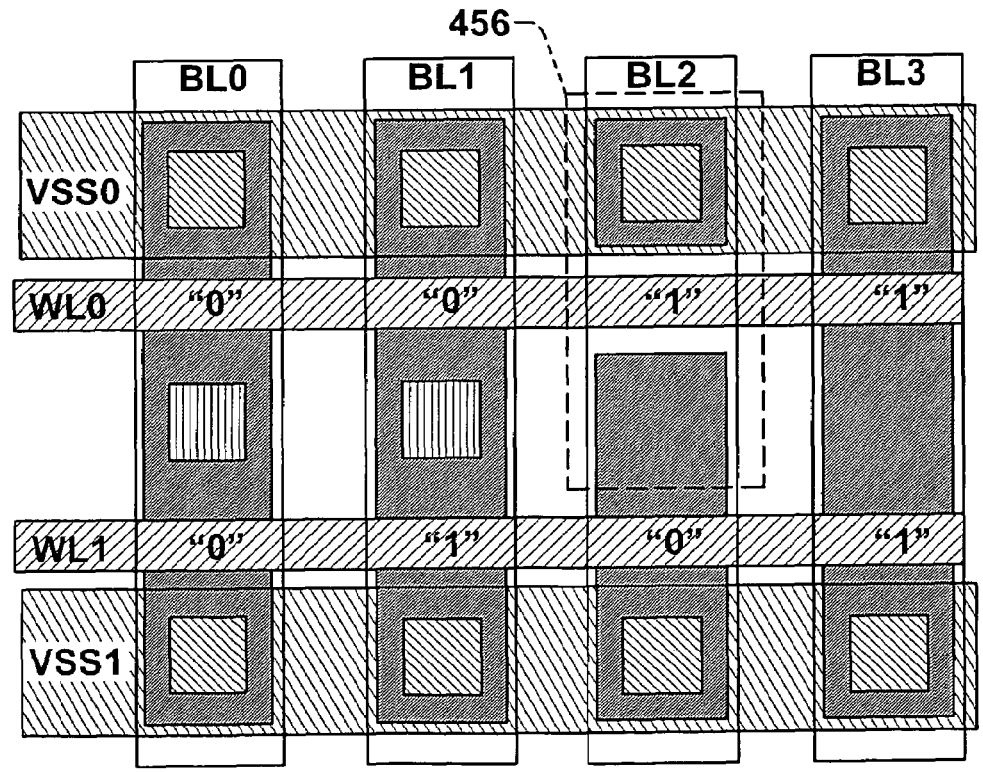

FIG. 4D shows the programming of the third memory cell 456, which can correspond to 414 in FIG. 4. Thus the current cell 456 has a value of one and the cell that shares the drain with the current cell has a value of zero. Therefore, the active area under and next to the word line of cell 456 is removed, so that it will be programmed to one. In a later step (e.g., FIG. 4H), the cell 464, which shares the drain with cell 456 will receive a drain contact so that it will be programmed to zero, as shown in step 406 in FIG. 4.

Figure 4E:
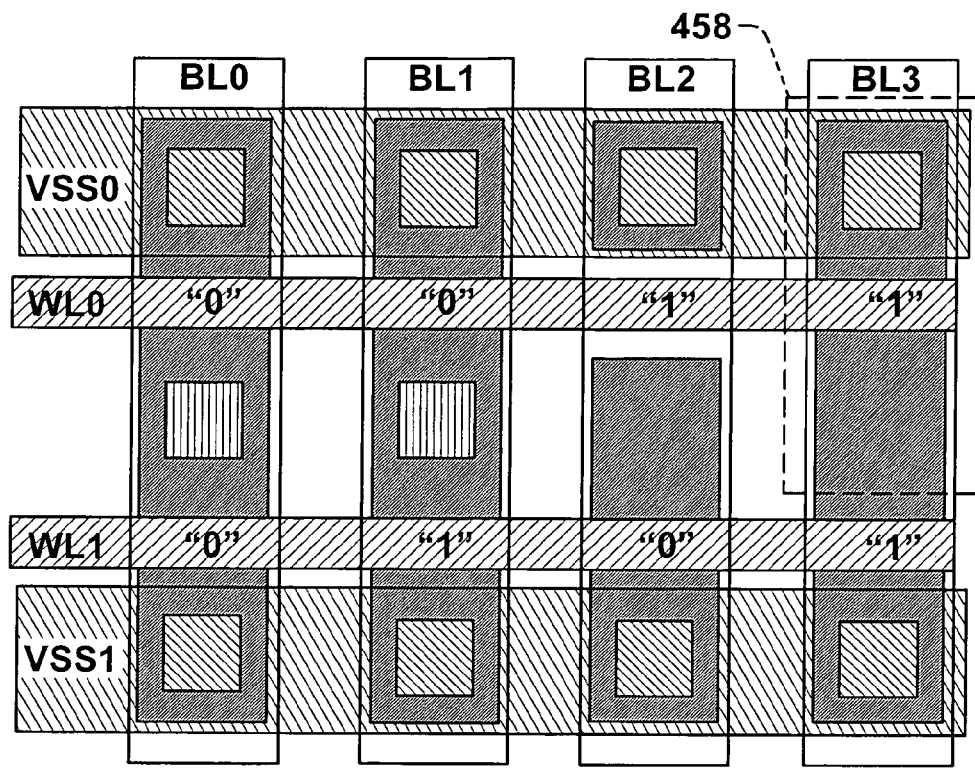

In FIG. 4E, a fourth memory cell 458 is programmed, which can correspond to 410 and 412 in FIG. 4. Thus, the current memory cell 458 has a value of one and the cell that shares the drain with the current cell also stores a value of one. No shared bit line contact is added, but rather the next cell will be programmed.

Figure 4F:
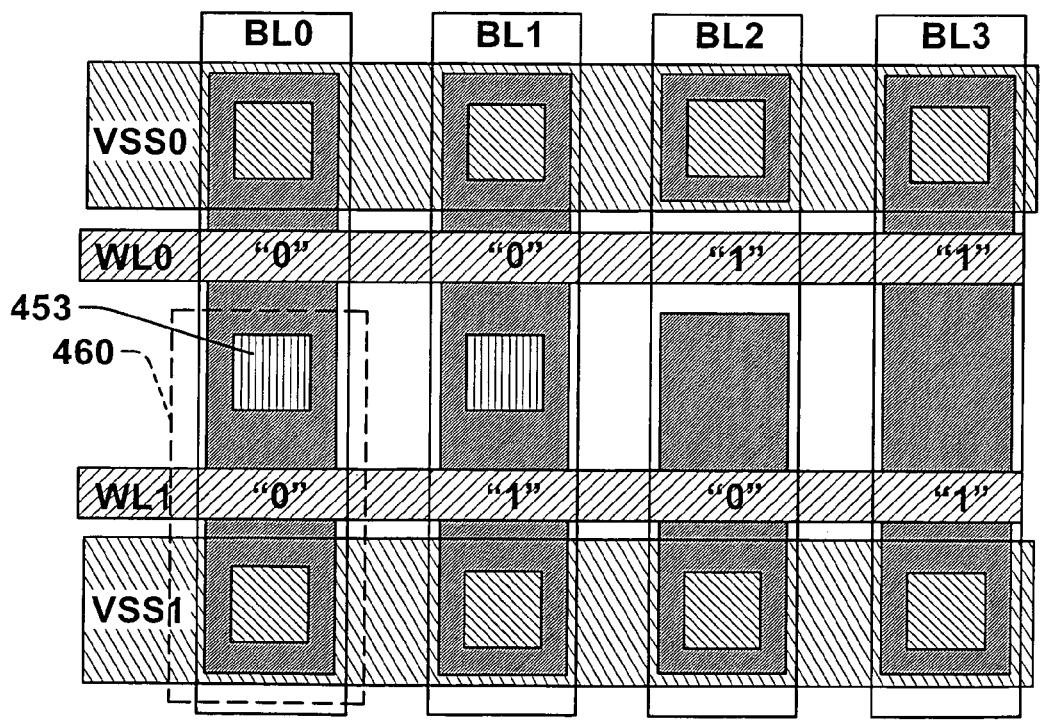

FIG. 4F shows the programming of the fifth memory cell 460, which can again correspond to 406 of FIG. 4. In this case shared bit line contact 453 is already present in the memory cell pair and no new contact needs to be added. Thus, no action needs to be taken before programming for next cell.

Figure 4G:
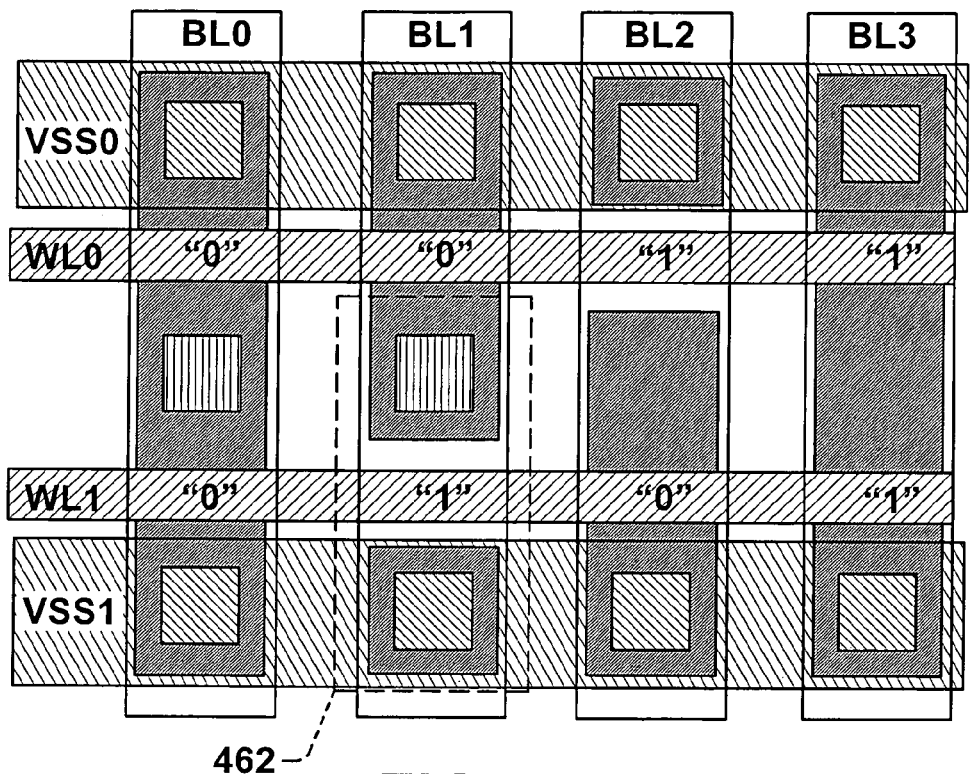

FIG. 4G shows the programming of the sixth memory cell 462, which can correspond to 414 of FIG. 4. Because the memory cell 462 is to store a one and the cell that shares the drain is to store zero, the active area under and next to the word line of cell 462 is removed.

Figure 4H:
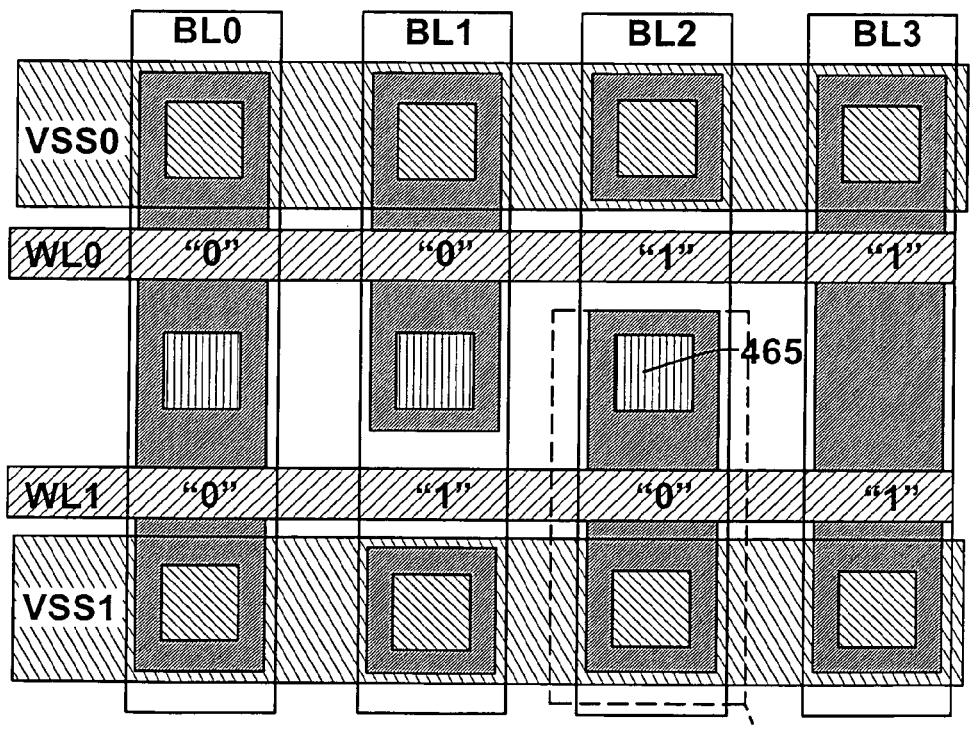

FIG. 4H shows the programming of the seventh memory cell 464, which can correspond to 406 of FIG. 4. As memory cell 464 stores a zero and there was no previous shared bit line contact for the associated memory cell pair, a shared bit line contact 465 is added at this step.

Figure 4I:
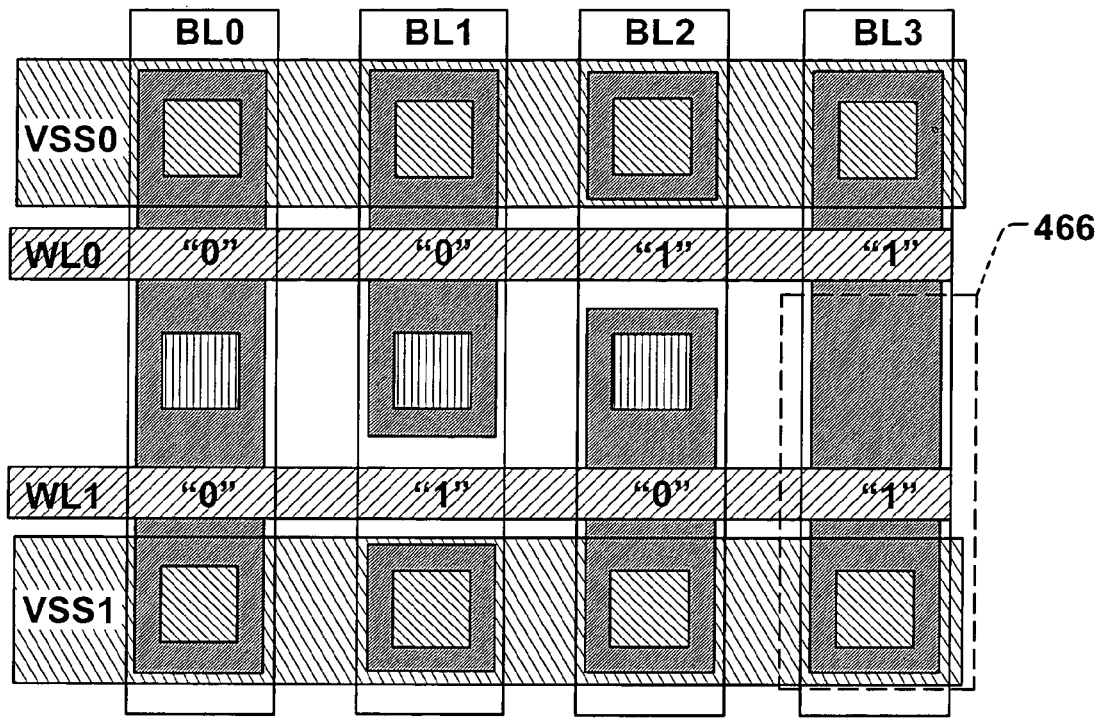

FIG. 4I shows the programming of the eighth memory cell 466. Because both memory cells of this memory cell pair store a one no shared bit line contact is added. Again, this electrically isolates BL3 from the ground lines VSS0 and VSS1, and retains the pre-charged voltage on BL3 when the cells are read.

Figure 4J:
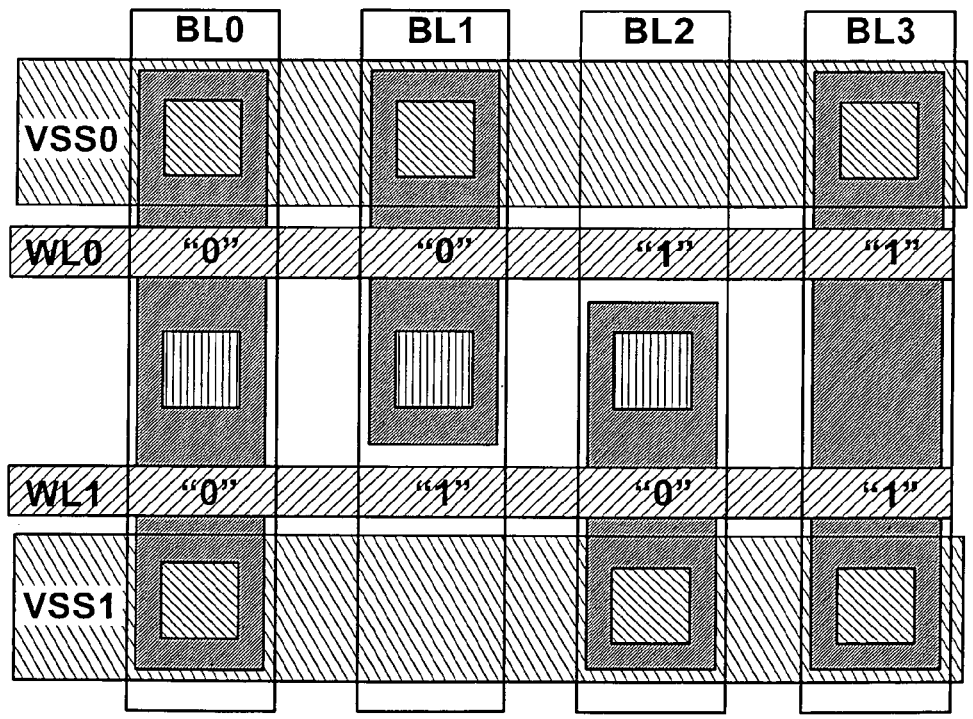

FIG. 4J shows how the unnecessary active regions adjacent to the word lines can be removed, which can correspond to 416 of FIG. 4. Note that the active regions to be removed in this step include sources shared by two adjacent cells which were both programmed to one. Thus, in the illustrated embodiment, the top and bottom cells would be shared within another row of memory cells, wherein the data values of these additional non-illustrated cells would need to be evaluated to determine whether the active regions of the cells are necessary or unnecessary.

Referring now to FIG. 5 and FIGS. 5A-5J, a method 500 directed towards limiting the height of a ROM memory cell is now described. More specifically, the height of a ROM memory cell may be limited by staggering the shared bit line contacts and/or ground contacts as a function of an offset as measured between adjacent word lines of the ROM. Such a configuration allows memory cells of the memory array to be more densely packed.

In general, the memory cells are programmed as a function of the data contained in the memory cell pairs. More specifically, the memory cells may be programmed by selectively coupling the bit lines to the common drain of the memory cell pair, selectively coupling the sources of the memory cell pairs to a ground wire, and/or by selectively removing active regions associated with the memory cell.

Referring now to FIG. 5, method 500 starts at 502 where an initial mask set is provided that has sources and a common drain associated with each memory cell pair, but no contacts present. Also note that the sources are shared with respect to additional rows of memory cells located above and below the illustrated cells, although these additional rows are not shown for purposes of clarity and conciseness.

At 504 a determination is made if the current cell is to be programmed with a one or a zero. If the cell is to be programmed with a zero (ZERO at 504), then method 500 proceeds to 506 and a shared bit line contact and a ground contact are added to the cell, unless such contacts are already in place. At this step, the shared bitline and ground contacts are placed at minimum distance from the word line of the current cell, and are not necessarily centered on the central plane between the adjacent wordlines. After the cell is programmed, the method proceeds to 508 where it determines if that cell was the last cell to be programmed. If not (NO at 508), the method increments the current memory cell and 510 and returns to 504 to program the next cell.

If the current memory cell is to store a one value ("ONE" at 504), then the method 500 proceeds to 512 and a determination is made as to whether the cell that shares a common drain with the current cell is a one or a zero. If the other cell in the memory cell pair stores a one value ("ONE" at 512), then the mask set is not altered and the methods proceeds to program another cell. By contrast, if the other cell in the memory cell pair stores of the zero value ("ZERO" at 512), then the method 500 proceeds to 514 where the active area under and next to the word line of the current cell is removed, so that the current cell will be programmed to one. This is to be done so that the remaining active areas will keep a minimum allowed distance from poly. As a result, in step 516, the shared contacts will be adjusted to become centered between poly tracks, wherever there are two adjacent zeros, as shown in FIG. 5. In addition, unnecessary contacts or active regions can be removed. The step 516 will provide symmetry, but it is not absolutely necessary. It may be considered optional.

After the last cell has been programmed (YES at 508), the method proceeds to 516 where the positions of the shared bit line contacts and the shared source contacts can be adjusted. In one embodiment, this adjustment will move the shared bit line contacts to become centered between poly tracks, wherever there are two adjacent zero cells sharing the drain or the source.

Figure 5A:
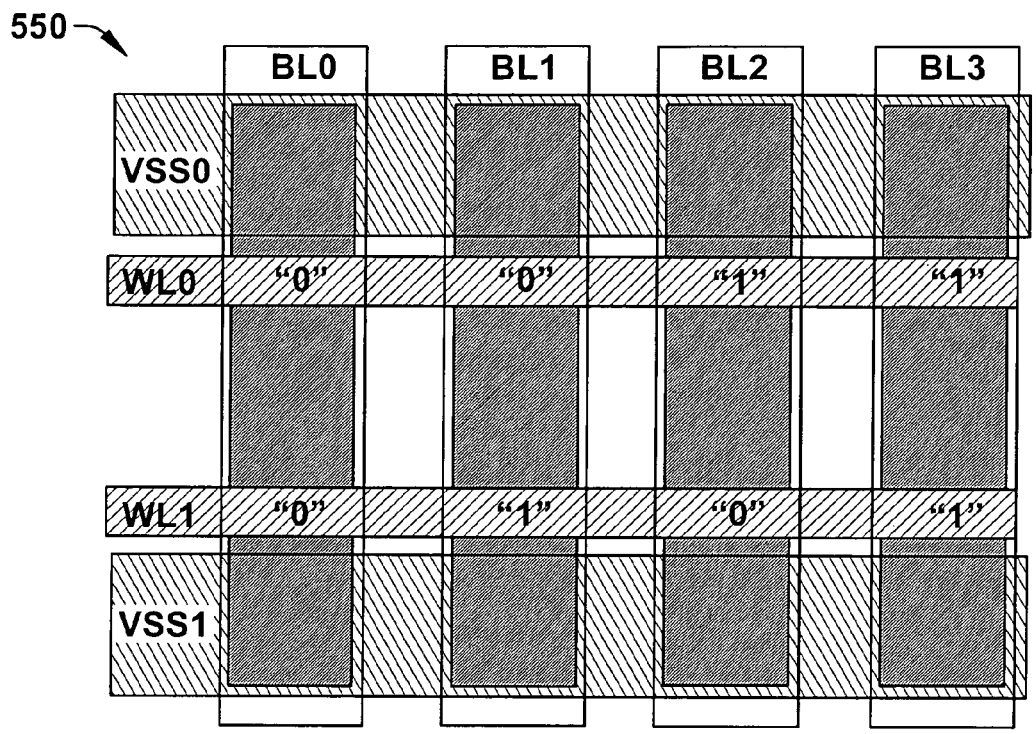

FIGS. 5A-5J now discuss one embodiment in accordance with method 500 for programming a ROM array that consists of eight memory cells to limit the height of individual memory cells. FIG. 5A shows an initial mask set 550 wherein logical values (i.e., "1"s and "0"s) that are to be programmed are superimposed on those memory cells. As previously mentioned all of the memory cells have common sources and common drains, but no contacts. Other initial mask sets could have various configurations, depending on the implementation.

Figure 5B:
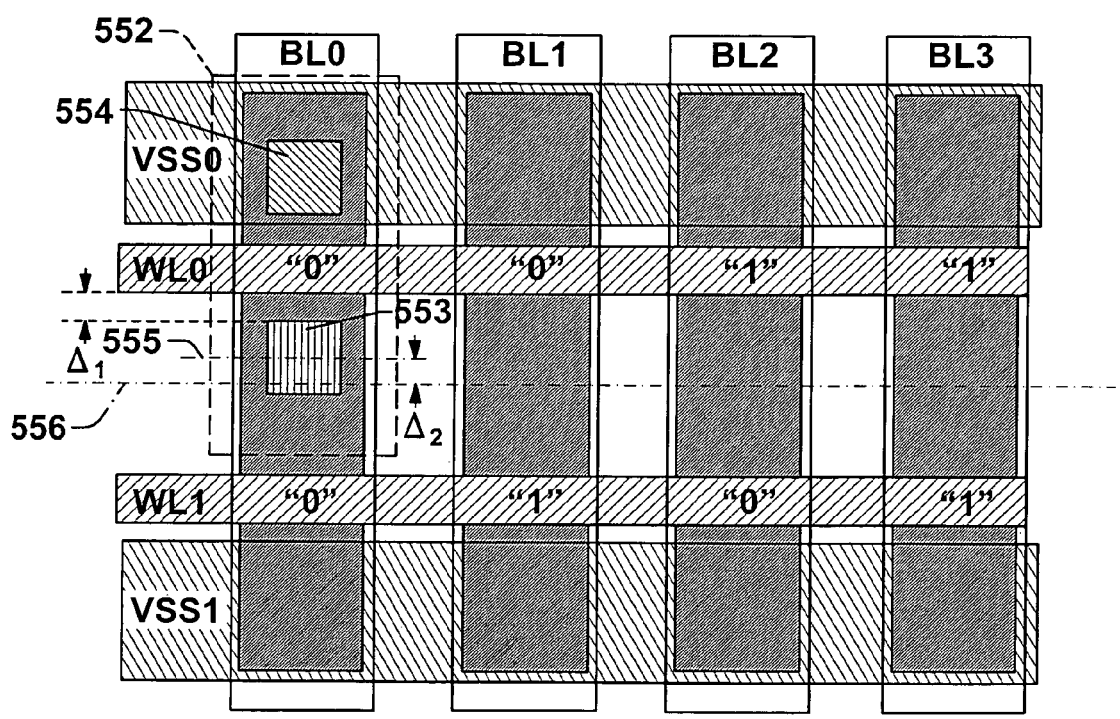

FIG. 5B shows the programming of the first memory cell 552, which can correspond to 506 of FIG. 5. A shared bit line contact 553 and a ground contact 554 are added to the memory cell as shown. The contacts 553, 554 can be placed at minimum distance $\Delta_1$ from the word line WL0. Thus, the center 555 of contact 553 is offset by a distance $\Delta_2$ relative to a central plane 556 between the adjacent wordlines WL0, WL1. As previously discussed, when the word line WL0 is asserted BL0 will be coupled to VSS0, pulling BL0 low and providing a "0" data value to the user from memory cell 552.

Figure 5C:
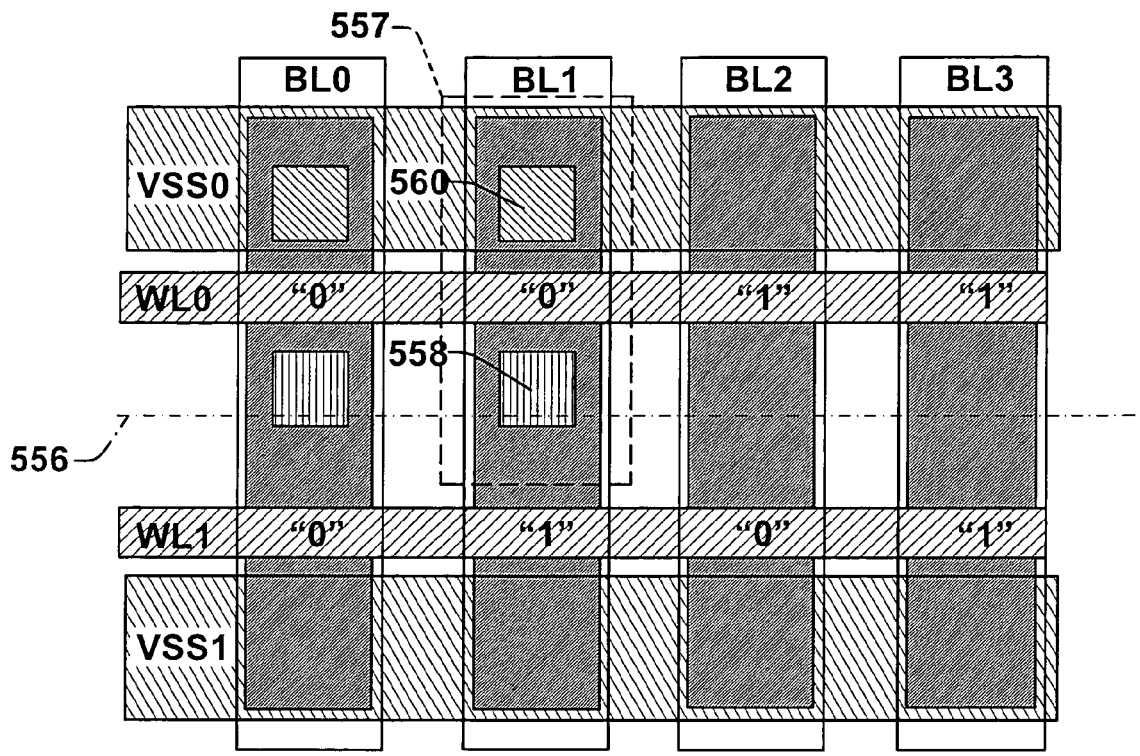

FIG. 5C shows the programming of the second memory cell 557, which can correspond to 506 of FIG. 5. Again, a shared bit line contact 558 and ground contact 560 are added to the memory cell as shown.

Figure 5D:
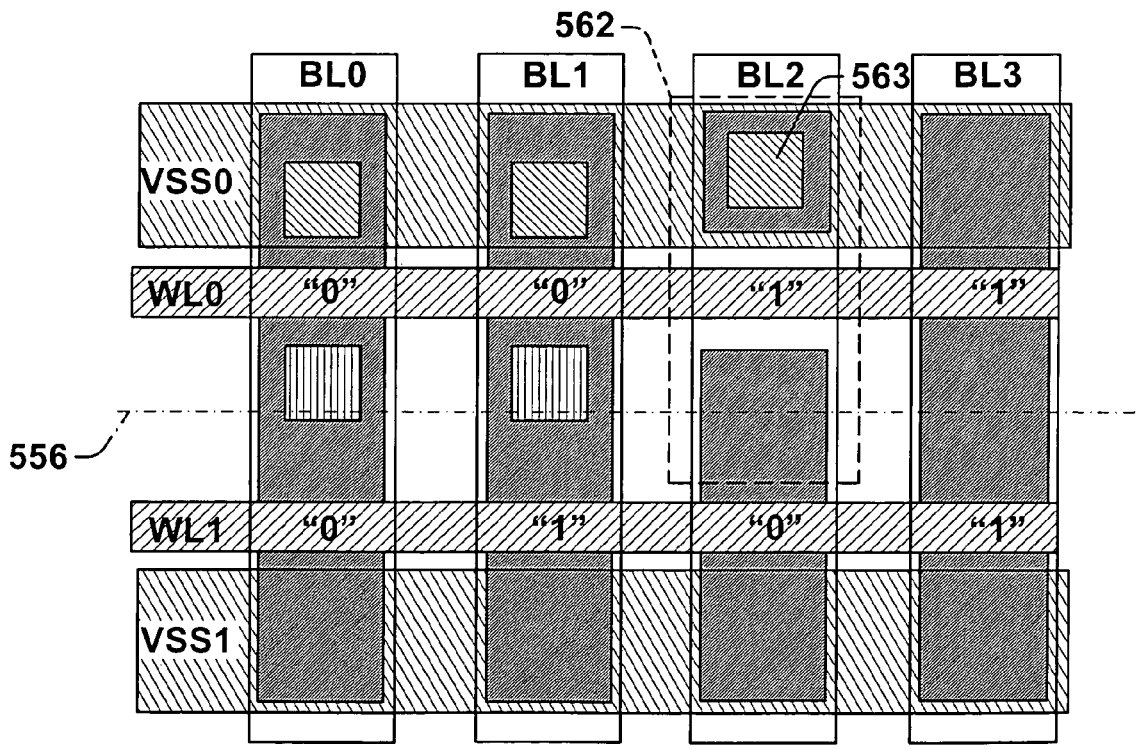

FIG. 5D shows the programming of a third memory cell 562, which can correspond to 514 of FIG. 5. Because the other memory cell of the memory cell pair associated with BL2 stores a "0" value, the active area under and next to the word line of the cell 562 is removed, so that the current cell will be programmed to one. This is to be done so that the remaining active areas will keep a minimum allowed distance from poly. Thus, BL2 remains electrically isolated from the ground lines VSS0 and VSS1 at this point, and the current memory cell will provide a "1" value when accessed by the user. Note, that a contact 563 may already be present and may be positioned near a wordline positioned above the cell (not shown), depending on the value of the cell in the row above (not shown).

Figure 5E:
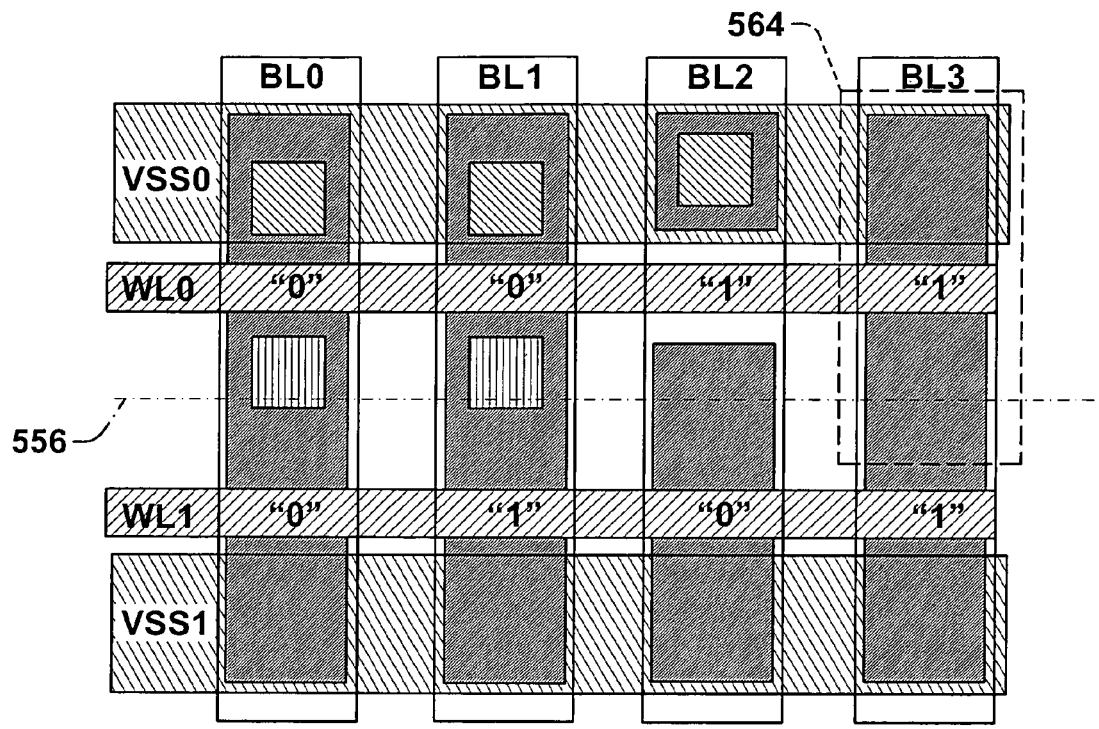

FIG. 5E shows the programming of a fourth memory cell 564, which can correspond to the path between 512 and 508 in FIG. 5. In this embodiment, no contacts are added and the source and drain remain intact.

Figure 5F:
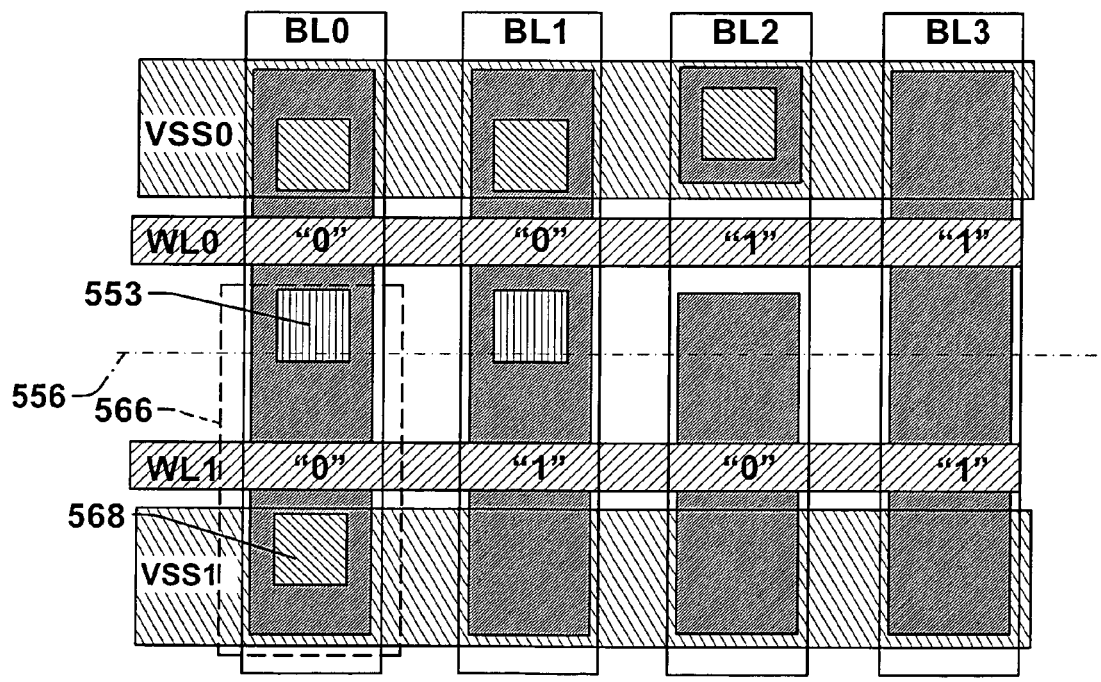

FIG. 5F shows the programming of a fifth memory cell 566, which can correspond to 506 of FIG. 5. Because the fifth memory cell 566 is to store a "0" data value, a ground contact 568 is added to couple the source to the ground line VSS1. Because the shared bit line contact 553 is already present, there is no need to add another such contact.

Figure 5G:
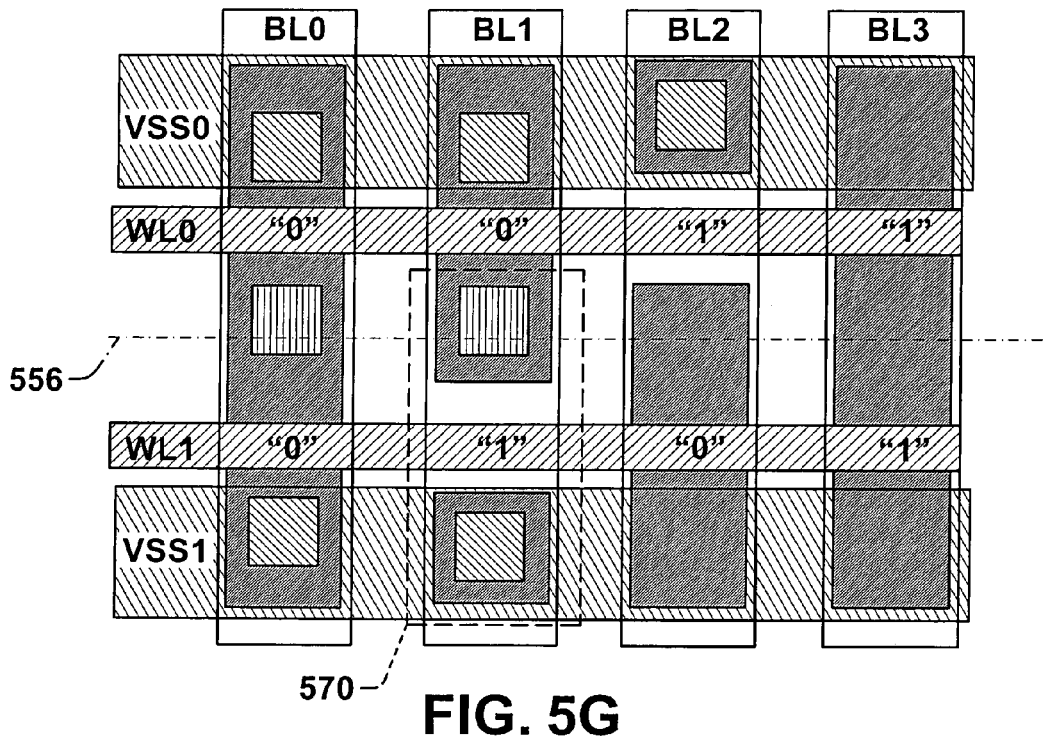

FIG. 5G shows the programming of a sixth memory cell 570, which can correspond to 514 of FIG. 5. Because the memory cell 570 is to store a "1" value, the active region under and next to WL1 removed, thereby electrically isolating BL1 from VSS1, even when WL1 is asserted.

Figure 5H:
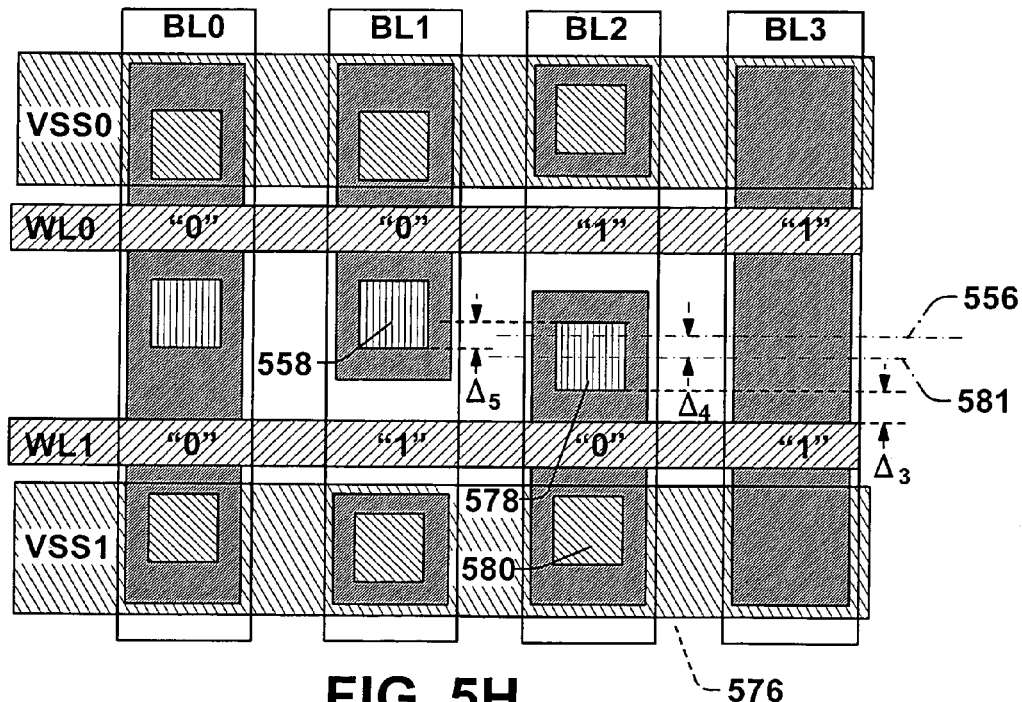

FIG. 5H shows the programming of a seventh memory cell 576, which can correspond to 506 of FIG. 5. Because this memory cell stores a zero value, a shared bit line contact 578 and a ground contact 580 are added to the memory cell. Again, the contacts 578, 580 can be placed at minimum distance $\Delta_3$ from the word line WL1. Thus, the center 581 of contact 578 is offset by a distance $\Delta_4$ relative to the central plane 556. Further, for the memory cell pairs storing a "0" value and a "1" value in opposite fashion (i.e., memory cell pairs associated with BL1 and BL2), the shared bit line contacts 558, 578 can be staggered with respect to one another by an offset $\Delta_5$.

Figure 5I:
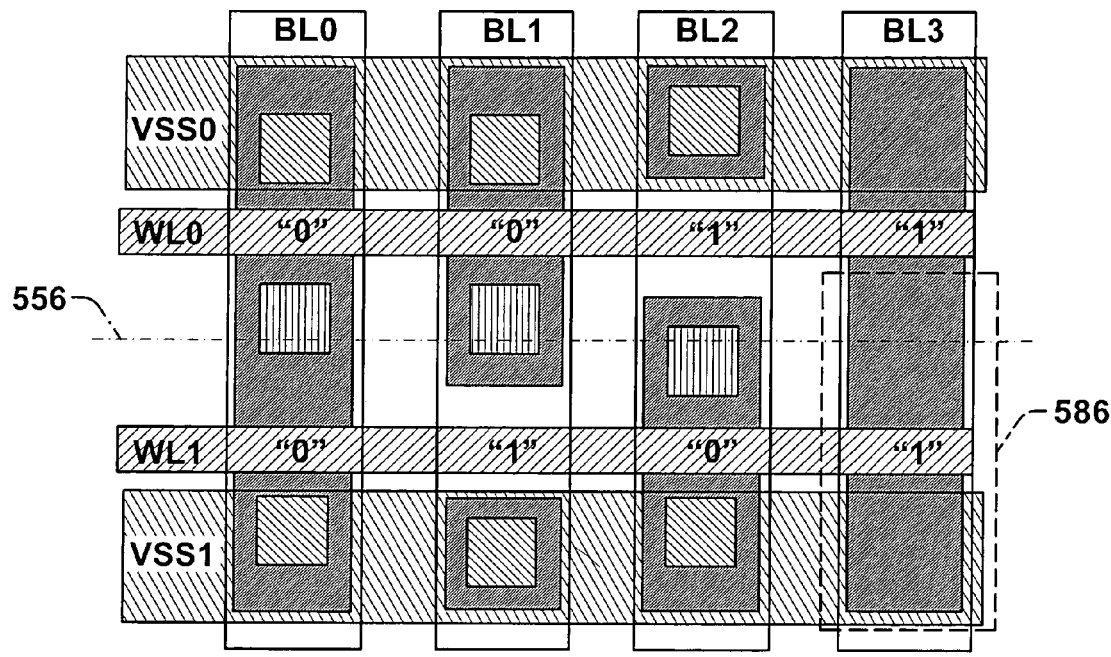

FIG. 5I shows the programming of an eighth memory cell 586, which can correspond to the path between 512 and 508 of FIG. 5. The programming of the eight memory cell can be similar, if not identical, to the programming of the fourth cell as previously described.

Figure 5J:
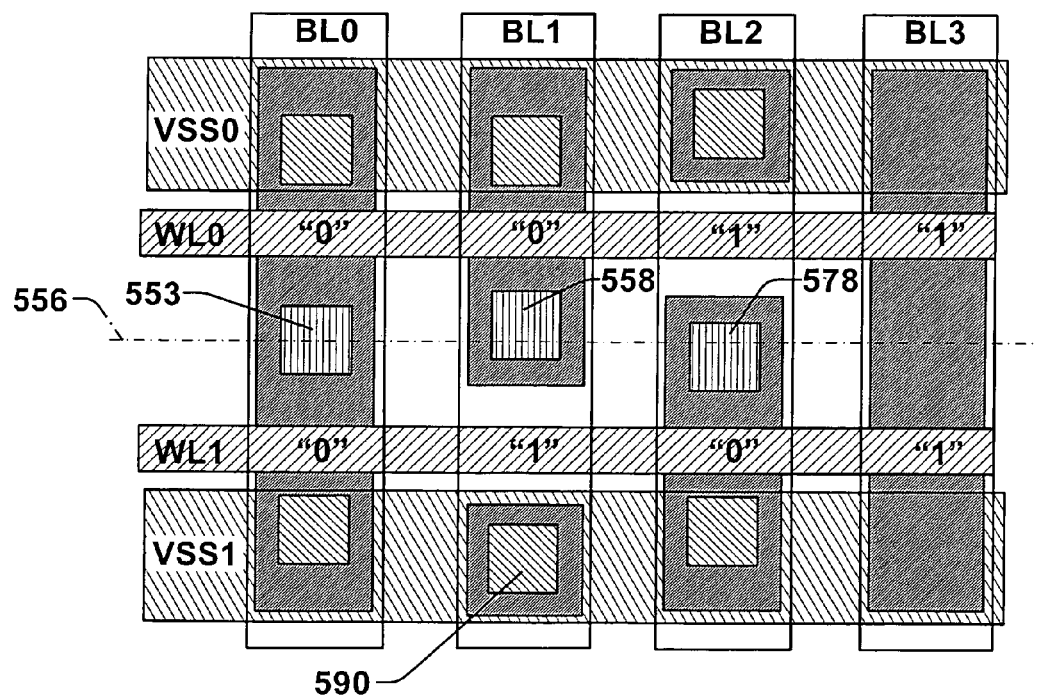

As shown in FIG. 5J, for memory cell pairs storing two "0" values (i.e., memory cell pair associated with BL0), the shared bit line contact 553 can be adjusted so that it is substantially centrally positioned with respect to the central plane 556. The shared bit line contact 553 could also be moved between the word lines WL0, WL1 in other fashions. In addition, unnecessary contacts or active regions can be removed at this time. For example, if the memory cell positioned directly below memory cell 570 (see FIG. 5G) stores a "1" value, then contact 590 may be unnecessary and could be removed. Other variations are also possible.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A read only memory including a memory cell pair with first and second memory cells that share a common drain, the memory cell pair comprising:

a first memory cell comprising:

a first source formed in a semiconductor substrate, the first source and common drain disposed along a linear line segment and separated from one another by a first region of semiconductor substrate; and a first wordline disposed over the first region of semiconductor substrate; and a second memory cell comprising:

a second source formed in the semiconductor substrate, the second source disposed along the linear line segment and separated from the common drain by a second region of semiconductor substrate;

a second wordline disposed over the second region of semiconductor substrate; and a bitline configured to read data from the first and second memory cells, wherein the bitline is electrically isolated from the common drain.

2. The read only memory of claim 1, wherein the bitline provides the same data from both the first and second memory cells.

3. The read only memory of claim 1, wherein a continuous active region of the memory cell pair extends entirely between the first and second wordlines.

4. A read only memory comprising a memory cell pair that comprises:

a first memory cell having a first source and a common drain disposed along a linear line segment, wherein the first source and the common drain are separated by a distance related to a first word line of the read only memory;

a second memory cell having a second source disposed along the linear line segment, where the second memory cell shares the common drain with the first memory cell and has a second wordline associated therewith; and a bitline configured to read data from the first and second memory cells as a function of the first and second wordlines, respectively, wherein the bitline is electrically isolated from the common drain.

5. The read only memory of claim 4, wherein bitline provides the same data from both the first and second memory cells.

6. A read only memory, comprising:

a number of memory cell pairs that are associated with two or more wordlines, wherein a memory cell pair comprises two memory cells that share a common drain coupled to a bitline of the memory cell pair; the two memory cells being respectively associated with two of the wordlines, and at least two contacts configured to couple the common drains of adjacent memory cell pairs to their respective bitlines, wherein the at least two contacts have different respective offsets as measured from a first of the two wordlines.

7. The read only memory of claim 6, wherein the different respective offsets are a function of data stored in the two memory cell pairs.

8. The read only memory of claim 6, wherein the at least two contacts are approximately symmetrically positioned between the two wordlines relative to a central plane approximately equidistant from the two wordlines.

9. The read only memory of claim 6, further comprising:

another contact that is configured to couple another bitline to another of the number of memory cell pairs within the row of memory cells;

wherein the another contact has another offset from the first of the two wordlines, the another offset being different from the respective offsets of the two contacts.

10. The read only memory of claim 9, wherein relative to a central plane that is approximately equidistant from the two wordlines, the two contacts are approximately symmetrically positioned between the two wordlines and the another contact is approximately centered on the central plane.

11. The read only memory of claim 6, wherein the two contacts are staggered such that an offset between the two contacts relates to the sum of ((a first distance between one of the two wordlines arid an edge of an active region) and (a second distance between the edge of the active region and an edge of one of the contacts)) minus (a third distance between another edge of the one of the contacts and the other of the two word lines).

12. The read only memory of claim 6, wherein a distance between the two word lines is less than 225 nm.

13. A read only memory comprising a number of memory cells arranged in a series of rows and columns, comprising:

a first memory cell pair along a first column, the first memory cell pair comprising: first and second memory cells that share a first common drain, wherein a first bitline contact couples the first common drain to a first bitline associated with the first memory cell pair, the first bitline contact arranged between first and second wordlines respectively associated with the first and second memory cells and offset by a first distance from the first wordline; and a second memory cell pair along a second column, the second memory cell pair comprising: third and fourth memory cells that share a second common drain, wherein a second bitline contact couples the second common drain to a second bitline associated with the second memory cell pair, the second bitline contact arranged between the first and second wordlines and offset by a second distance from the first wordline, the second distance being different than the first distance.

14. The read only memory of claim 13, wherein the first and second distances are a function of data values stored in the memory cells.

15. The read only memory of claim 13, wherein the first and second bitline contacts are approximately symmetrically positioned between the first and second wordlines relative to a central plane approximately equidistant from the first and second wordlines.

16. The read only memory of claim 13, further comprising:

a third memory cell pair along a third column, the third memory cell pair comprising: fifth and sixth memory cells that share a third common drain, wherein a third bitline contact couples the third common drain to a third bitline associated with the third memory cell pair, the third bitline contact arranged between the first and second wordlines and offset by a third distance from the first wordline, the third distance being different than the first and second distances.

17. The read only memory of claim 16, wherein relative to a central plane that is approximately equidistant from the first and second wordlines, the first and second bitline contacts are approximately symmetrically positioned between the first and second wordlines, and the third bitline contact is approximately centered on the central plane.

* * * * *